US006768151B2

United States Patent
Kasai

(10) Patent No.: US 6,768,151 B2
(45) Date of Patent: Jul. 27, 2004

(54) SEMICONDUCTOR MEMORY DEVICE WITH MEMORY CELLS HAVING SAME CHARACTERISTICS AND MANUFACTURING METHOD FOR THE SAME

(75) Inventor: Naoki Kasai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/346,071

(22) Filed: Jan. 17, 2003

(65) Prior Publication Data

US 2003/0104674 A1 Jun. 5, 2003

Related U.S. Application Data

(62) Division of application No. 10/139,510, filed on May 7, 2002.

(30) Foreign Application Priority Data

May 16, 2001 (JP) ........................................ 2001-146158

(51) Int. Cl.[7] ........................ H01L 29/76; H01L 29/108
(52) U.S. Cl. ........................ 257/295; 257/306; 257/310; 257/532
(58) Field of Search ................................ 257/295, 306, 257/310, 532; 438/3, 240

(56) References Cited

U.S. PATENT DOCUMENTS

| 5,122,477 | A | * | 6/1992 | Wolters et al. ................. 438/3 |
| 5,879,982 | A | * | 3/1999 | Park et al. .................. 438/241 |
| 6,004,839 | A | * | 12/1999 | Hayashi et al. ............. 438/210 |
| 6,198,652 | B1 | * | 3/2001 | Kawakubo et al. ......... 365/145 |
| 6,303,478 | B1 | * | 10/2001 | Nakamura et al. .......... 438/570 |
| 6,432,769 | B1 | * | 8/2002 | Fukuda et al. ............. 438/244 |
| 6,524,905 | B2 | * | 2/2003 | Yamamichi et al. ........ 438/240 |
| 2001/0020708 | A1 | * | 9/2001 | Kasai ......................... 257/295 |
| 2001/0034069 | A1 | * | 10/2001 | Nakura et al. ................. 438/3 |

FOREIGN PATENT DOCUMENTS

| JP | 4-168765 | 6/1992 |
| JP | 11-74482 | 3/1999 |

* cited by examiner

*Primary Examiner*—Mary Wilczewski
*Assistant Examiner*—Toniae M. Thomas
(74) *Attorney, Agent, or Firm*—Sughrue Mion, PLLC

(57) ABSTRACT

In a method of manufacturing a semiconductor memory device, a lower electrode film is formed on a semiconductor substrate via an interlayer insulating film. A ferroelectric film is formed on the lower electrode layer while heating the lower electrode layer uniformly in the cell array region. An upper electrode film is formed on the ferroelectric film. Ferroelectric capacitors are formed in a memory cell array region. Each of the ferroelectric capacitors includes the lower electrode film, the ferroelectric film and the upper electrode film.

15 Claims, 16 Drawing Sheets

SEMICONDUCTOR MEMORY DEVICE WITH MEMORY CELLS HAVING SAME CHARACTERISTICS AND MANUFACTURING METHOD FOR THE SAME

This is a divisional of Application No. 10/139,510 filed May 7, 2002; the disclosure of which is incorporated herein by reference.

BACKGROUND OF THE INVENTION

1. Field of the Invention

The present invention relates to a semiconductor memory device which has a ferroelectric capacitor. More particularly, the present invention relates to the technique for achieving uniform operation characteristics over the whole of a memory cell array region of the semiconductor memory device.

2. Description of the Related Art

A semiconductor memory device which has a ferroelectric capacitor is conventionally known. An example of such a conventional semiconductor memory device will be described using a logic circuit embedded FeRAM (Ferroelectric Random Access Memory). FIG. 1 shows an example of the circuit layout of a macro of the logic circuit embedded FeRAM.

Referring to FIG. 1, the macro of the logic circuit embedded FeRAM has a plurality of memory cell arrays. Sense amplifiers are arranged to sandwich each memory cell array in a horizontal direction, and word line and plate line drivers are arranged to sandwich a set of the sense amplifiers and the memory cell arrays in a vertical direction. Moreover, an X decoder is arranged above the uppermost word line and plate line driver. A Y decoder is arranged on the left side of the sets of the sense amplifiers and the memory cell arrays. A space is provided between the memory cell array and the sense amplifier and between the memory cell array and the word line and plate line driver. The space is hereinafter called a "connection region".

FIG. 2 shows a circuit diagram of FeRAM cells of the memory cell array. As shown in FIG. 2 as a unit cell of 2T2C, the FeRAM cell is comprised of two transistors and two ferroelectric capacitors. The FeRAM cell with the structure of 2T2C holds data by applying two voltages of different polarities to the ferroelectric capacitors. In case of reading the data, plate lines are biased from a ground voltage to a power supply voltage and the electric charge from the ferroelectric capacitor with the polarity inverted and the electric charge from the ferroelectric capacitor with the polarity non-inverted are outputted onto a pair of bit lines. Then, the voltage difference on the pair of bit lines is amplified by the sense amplifier and outputted outside.

FIG. 3 shows a cross sectional view of the conventional logic circuit embedded FeRAM formed as mentioned above. The logic circuit embedded FeRAM has a 3-layer wiring line structure. The logic circuit embedded FeRAM has a memory cell array region where the FeRAM cells are arranged, a peripheral circuit region where peripheral circuits such as the sense amplifier, the word line driver and the plate line driver are arranged, and a connection region formed between them.

In the memory cell array region, the ferroelectric capacitor is comprised of an upper electrode, a ferroelectric film and a lower electrode and is formed on an uppermost aluminum wiring line layer containing third metal wiring lines. In the connection region, a dummy capacitor shown by slanted lines is comprised of the upper electrode, the ferroelectric film and the lower electrode. The dummy capacitor functions to prevent 2-dimension effects such as proximity effect and pattern sparse dense effect in a lithography process or a dry etching process in the connection region so that the ferroelectric capacitors are formed to have a predetermined size over the whole of the memory cell array region.

By the way, the logic circuit embedded FeRAM has the ferroelectric capacitors on an aluminum wiring line layer, as described above, and a contact plug is comprised of tungsten. The aluminum wiring line layer is damaged when annealing is carried out in a high temperature (600° C. to 750° C.) to form the ferroelectric capacitor. Therefore, a crystal growth method is conventionally adopted to form the ferroelectric capacitor at a relatively low temperature. In this case, it is essential to form the ferroelectric capacitor at the growth temperature of 450° C. or below to maintain the reliability of the contact plug and the aluminum wiring line. Generally, when the growth temperature of a PZT (Pb(Zr$_x$, Ti$_{1-x}$)O$_3$) film as a ferroelectric film is lowered, the crystalline of the PZT film is degraded and the ferroelectric characteristics are degraded.

The characteristic 1 (solid line) in FIG. 4 shows the ferroelectric characteristics when the PZT film is formed at the growth temperature of 450° C. In this case, the ferroelectric capacitor with large polarization can be formed. Also, the characteristic 2 (broken line) shows the ferroelectric characteristics when the PZT film is formed at the growth temperature of 430° C. In the case, the ferroelectric capacitor with small polarization is formed.

FIG. 5 is a diagram showing the bit line voltage difference of all the FeRAM cells of a test memory cell array which contains the cells for voltage measurement. In FIG. 5, the bit line voltage difference from 0 V to about 1.3 V is shown in a sparse dense manner of dots. A part of a darker color shows a larger bit line voltage difference. Each of the FeRAM cells has the PZT film manufactured at the growth temperature of 430° C. The FeRAM cell has a larger bit line voltage difference or a larger operation margin when the bit line voltage difference is larger. Referring to FIG. 5, the operation margin of the FeRAM cell is large in a right end section and in the center section and the operation margin of the FeRAM cell is small in an upper end section and a lower end section. The operation margin depends on the characteristics of the ferroelectric capacitor, as shown in FIG. 4. That is, the operation margin is large when the polarization is large like the characteristic 1, and the operation margin is small when the polarization is small like the characteristic 2.

The deviation in the operation margin depending on the physical position of the FeRAM cell results from the difference in the characteristics of the FeRAM cells, as shown in FIG. 5. It could be considered that the deviation is based on the surface temperature of the lower electrode, which is generally comprised of platinum (Pt), of the ferroelectric capacitor when the PZT film is formed.

In conjunction with the above description, a semiconductor memory device is disclosed in Japanese Laid Open Patent Application (JP-A-Heisei 4-168765). In this reference, the memory device is comprised of a memory cell array region where a plurality of memory cells are formed, each of which is comprised of a memory transistor and a capacitor, and a peripheral circuit region where a plurality of peripheral circuit transistors are formed. The memory device is formed on a semiconductor substrate. A set of gate electrode films is arranged in parallel in the memory cell array region to have a predetermined space. Thus, using the gate electrodes, memory transistors are formed. A set of gate electrode films is arranged in parallel in the peripheral circuit region to have a predetermined space. Thus, using the gate electrodes, peripheral circuit transistors are formed. Dummy wiring lines are also formed in the peripheral circuit region. The space between the gate electrodes films in the memory cell array region is substantially the same as the space between the gate electrodes films or between the gate electrode and the dummy wiring line in the memory cell array region.

Also, a semiconductor device is disclosed in is disclosed in Japanese Laid Open Patent Application (JP-A-Heisei 11-74482). In the reference, a plurality of semiconductor devices are formed on a semiconductor substrate in a memory cell region to have conductive films piled via insulating films. A dummy pattern has at least a conductive film and is formed on a position closer to the peripheral transistor region than any one of the semiconductor devices. An interlayer insulating film covers the semiconductor devices and the dummy pattern and has an inclined portion between the memory cell region and the peripheral transistor region. A part of the dummy pattern is exposed from the interlayer insulating film.

SUMMARY OF THE INVENTION

Therefore, an object of the present invention is to provide a semiconductor memory device and a manufacturing method, in which memory cells with large operation margins can be formed over the whole of a memory cell array region.

In an aspect of the present invention, a method of manufacturing a semiconductor memory device is achieved by (a) forming a lower electrode film on a semiconductor substrate via an interlayer insulating film; by (b) forming a ferroelectric film on the lower electrode layer while heating the lower electrode layer; by (c) forming an upper electrode film on the ferroelectric film; and by (d) forming ferroelectric capacitors in a memory cell array region, each of the ferroelectric capacitors comprising the lower electrode film, the ferroelectric film and the upper electrode film.

Here, it is desirable that the lower electrode film is formed of material containing at least one of platinum, iridium, iridium oxide, ruthenium and ruthenium oxide.

Also, the method may further comprise the step of (e) forming thermally conductive routes in the memory cell array region and a connection region outside the memory cell array region to pass through the interlayer insulating film to the semiconductor substrate, and to be connected with the lower electrode film. The lower electrode film is heated via the thermally conductive routes. In this case, it is desirable that contact plugs for the routes passing through a portion of the interlayer insulating film are formed each time the interlayer insulating film portion is formed. Also, the heating may be achieved by heating the semiconductor substrate.

Also, it is desirable that a density of the thermally conductive routes in the memory cell array region is substantially the same as that of the thermally conductive routes in the connection region Also, additional thermally conductive routes may be formed in the interlayer insulating film in a peripheral circuit region outside the connection region to be connected with the thermally conductive routes in the connection region.

Also, the (b) forming step may desirably include heating the semiconductor substrate to about 450° C.

Also, the (a) forming step may be achieved by forming the lower electrode film to extend outside the memory cell array region.

In another aspect of the present invention, a semiconductor memory device having a memory cell array region, a peripheral circuit region and a connection region between the memory cell array region and the peripheral circuit region, includes ferroelectric capacitors formed on a semiconductor substrate via an interlayer insulating film in the memory cell array region; and conductive films formed on the interlayer insulating film in the connection region. The conductive films are connected with the semiconductor substrate via conductive routes passing through the interlayer insulating film, respectively.

Here, a layer for the conductive films may be formed when a lower electrode layer for the ferroelectric capacitors is formed. In this case, the lower electrode layer may be formed of material containing at least one of platinum, iridium, iridium oxide, ruthenium and ruthenium oxide.

Also, the semiconductor memory device may further include MOS transistors formed on the semiconductor substrate in the memory cell array region and the connection region. Each of the ferroelectric capacitors may be connected with one of the MOS transistors formed in the memory cell array region and each of the conductive films may be connected with one of the MOS transistors formed in the connection region.

Also, it is desirable that a density of the ferroelectric capacitors is substantially the same as that of the conductive films.

Also, the semiconductor memory device may further include additional conductive films formed in the peripheral circuit region. The additional conductive films may be connected with any of the conductive routes in the connection region.

The semiconductor memory device may be a logic circuit embedded FeRAM, or a logic circuit embedded non-volatile SRAM.

In another aspect of the present invention, a method of manufacturing a semiconductor memory device, may be achieved by (a) forming MOS transistors in a memory cell array region and a connection region outside the memory cell array region, wherein a density of the MOS transistors in the memory cell array region is substantially the same as that of the MOS transistors in the connection region; by (b) forming an interlayer insulating film to cover the MOS transistors while forming thermally conductive routes, each of which extends from one of the MOS transistors to pass through the interlayer insulating film; by (c) forming a lower electrode film on a semiconductor substrate via the interlayer insulating film to be connected with the thermally conductive routes; by (d) forming a ferroelectric film on the lower electrode layer while heating the lower electrode layer; by (e) forming an upper electrode film on the ferroelectric film; and by (f) forming ferroelectric capacitors in the memory cell array region, each of the ferroelectric capacitors comprising the lower electrode film, the ferroelectric film and the upper electrode film.

In another aspect of the present invention, a method of manufacturing a semiconductor memory device, may be achieved by (a) forming MOS transistors in a memory cell array region and a connection region outside the memory cell array region, wherein a density of the MOS transistors in the memory cell array region is substantially the same as that of the MOS transistors in the connection region; by (b) forming an interlayer insulating film to cover the MOS transistors while forming thermally conductive routes, each of which extends from one of the MOS transistors to pass through the interlayer insulating film; by (c) forming a lower electrode film on a semiconductor substrate via the interlayer insulating film to be connected with the thermally conductive routes; by (d) forming a ferroelectric film on the lower electrode layer while heating the lower electrode layer via the thermally conductive routes; by (e) forming an upper electrode film on the ferroelectric film; and by (f) forming ferroelectric capacitors in the memory cell array region, each of the ferroelectric capacitors comprising the lower electrode film, the ferroelectric film and the upper electrode film.

Here, the (b) forming step further may be achieved by forming additional thermally conductive routes in the interlayer insulating film in a peripheral circuit region outside the connection region to be connected with the thermally conductive routes in the connection region.

DESCRIPTION OF THE PREFERRED EMBODIMENTS

Hereinafter, a semiconductor memory device and a manufacturing method for the same of the present invention will be described in detail with reference to the attached drawings.

(Embodiment 1)

The semiconductor memory device according to the first embodiment of the present invention relate to a logic circuit embedded FeRAM.

Figure 1:
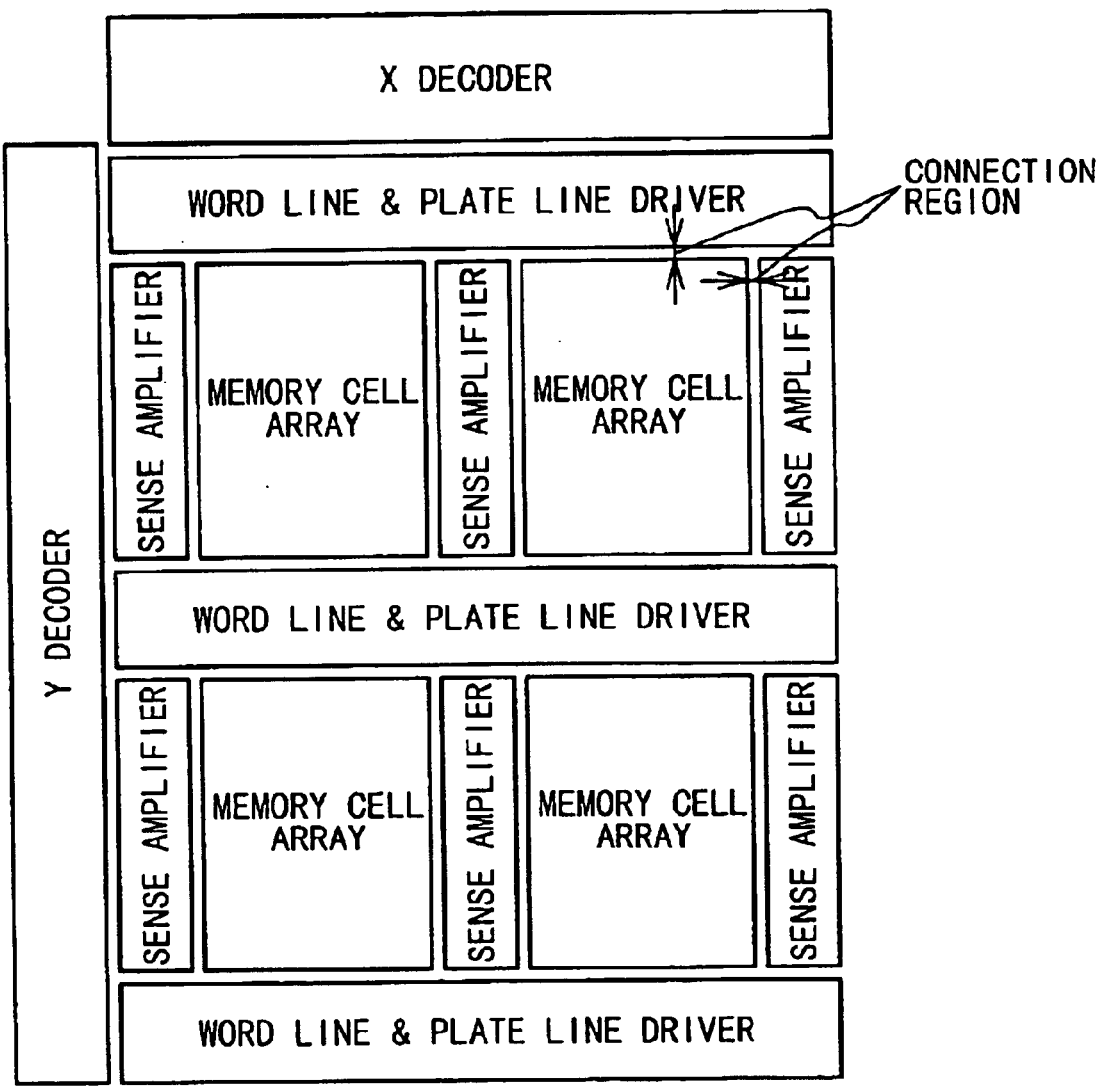
FIG. 1 is a circuit diagram showing the circuit layout of a typical logic circuit embedded FeRAM.

The semiconductor memory device according to the first embodiment of the present invention has the same circuit layout as that of the conventional logic circuit embedded FeRAM shown in FIG. 1. That is, the logic circuit embedded FeRAM macro has a plurality of memory cell arrays. Sense amplifiers are arranged to sandwich each memory cell array in a horizontal direction, and sets of a word line driver and a plate line driver are arranged to sandwich a set of the two memory cell arrays and the three sense amplifiers. Moreover, an X decoder is arranged above the top of the sets of the word line driver and the plate line driver. A Y decoder is arranged on the left side of the three sets of the word line driver and the plate line driver and the two sets of the two memory cell arrays and the three sense amplifiers. Thus, a connection region is formed between the memory cell array and the sense amplifier and between the memory cell array and the set of the word line driver and the plate line driver.

Figure 2:
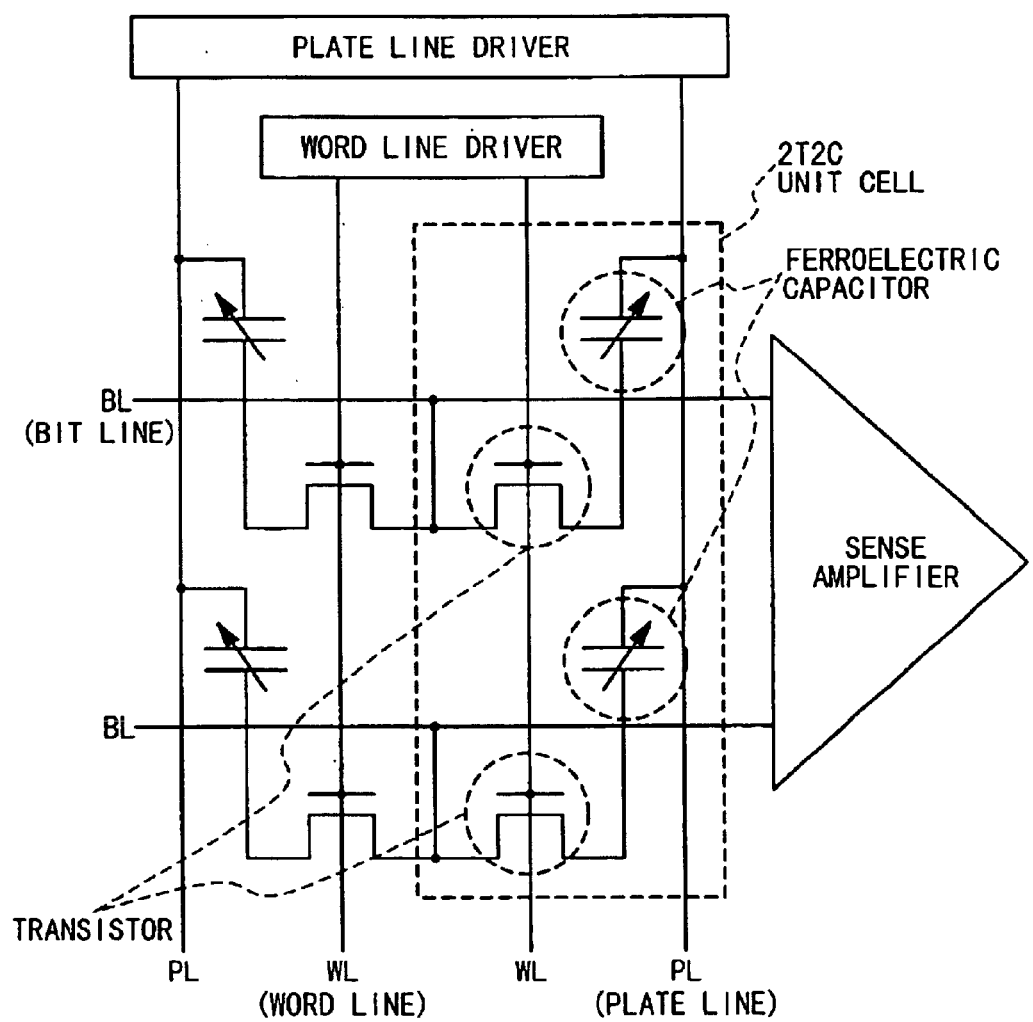
FIG. 2 is a circuit diagram of a typical FeRAM cell of the logic circuit embedded FeRAM.
Figure 3:
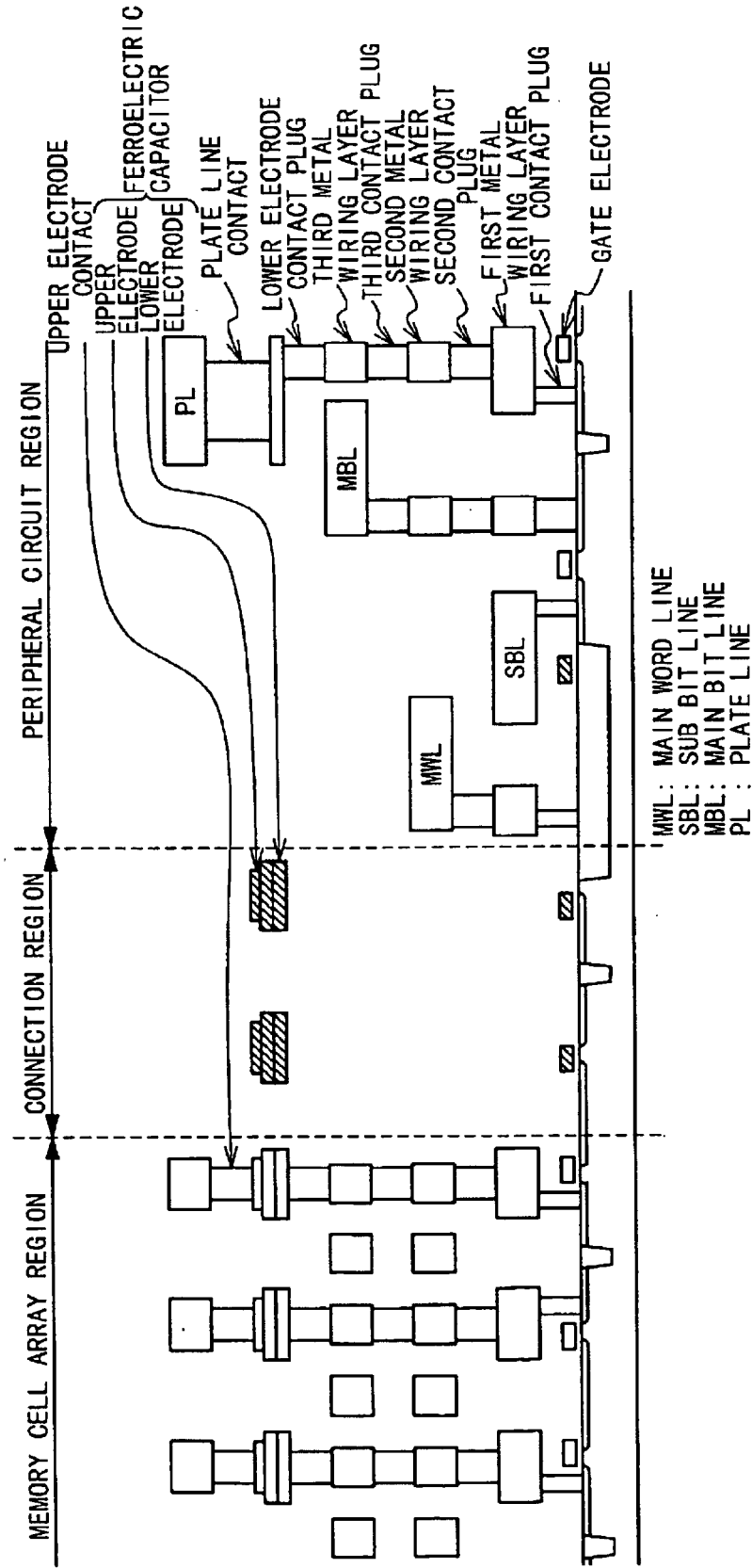
FIG. 3 is a cross sectional view of a conventional logic circuit embedded FeRAM.
Figure 4:
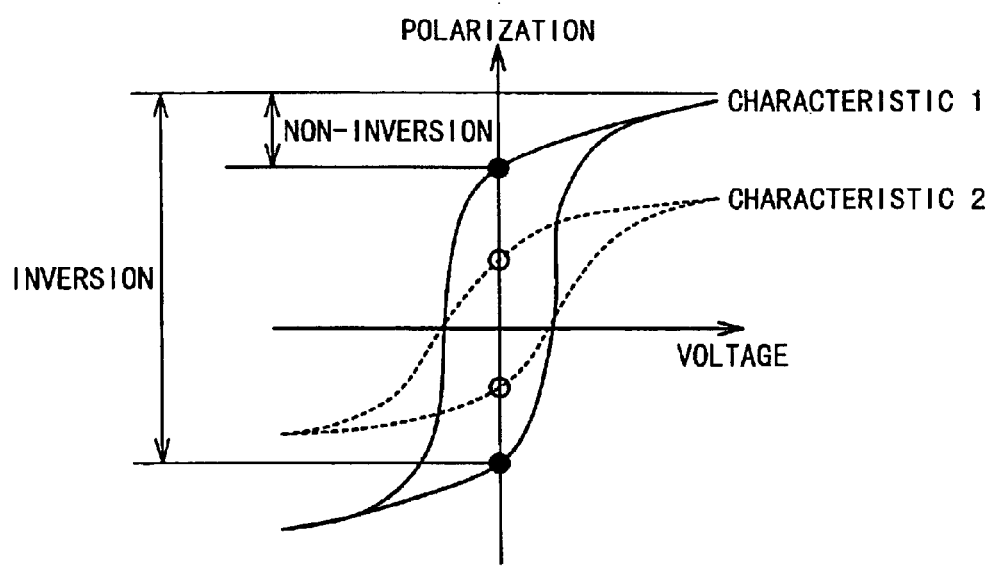
FIG. 4 is a diagram showing the difference in the ferroelectric characteristics depending on the forming temperature of a ferroelectric film.
Figure 5:
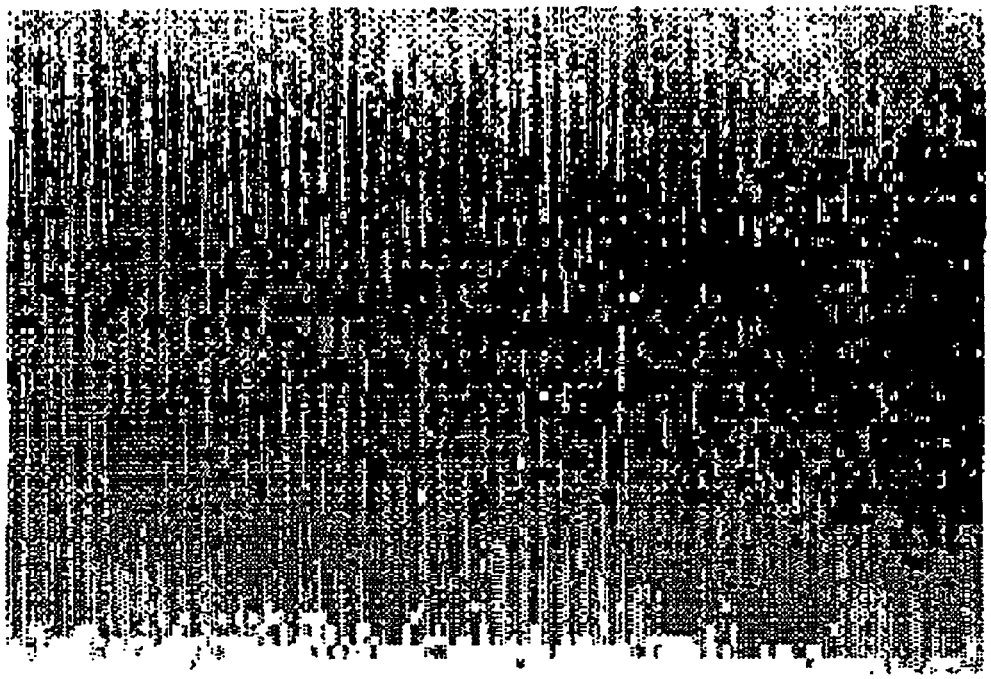
FIG. 5 is a diagram showing a bit line voltage difference in all the FeRAM cells of a memory cell array in the conventional logic circuit embedded FeRAM.

The semiconductor memory device according to the first embodiment of the present invention has the same circuit as the FeRAM cell shown in FIG. 2. That is, as shown in FIG. 2 as a unit cell of 2T2C, the FeRAM cell is comprised of two transistors and two ferroelectric capacitors. In the FeRAM cell with the structure of 2T2C, voltages of different polarities are applied to the two ferroelectric capacitors to store data. When the data is read out, the voltage of the plate line is increased from the ground voltage to a power supply voltage. At this time, the electric charge of the capacitor with the polarity inverted and the electric charge of the capacitor with the polarity non-inverted are transferred onto a pair of bit lines. The voltage difference on the bit lines is amplified by a sense amplifier and outputted.

Figure 6:
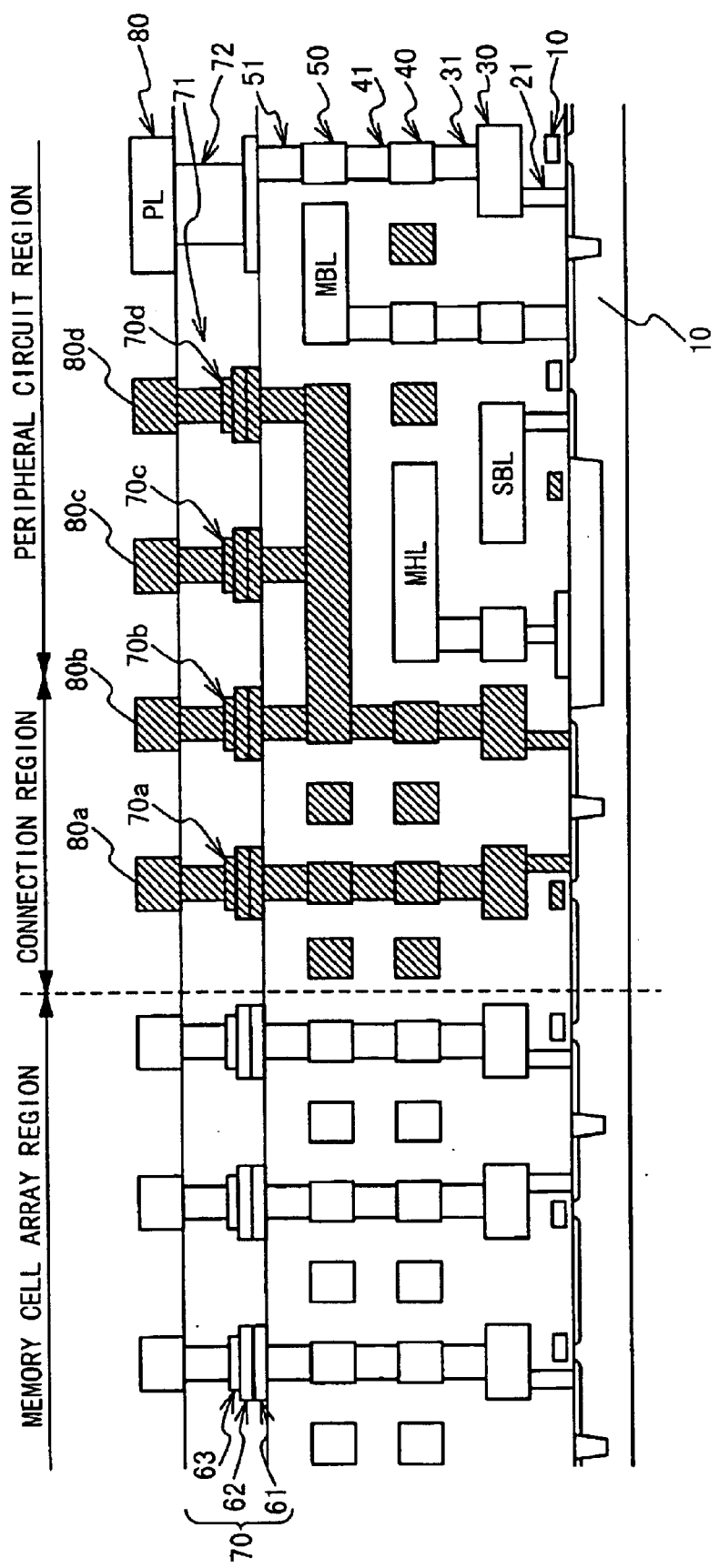
FIG. 6 is a cross sectional view of a logic circuit embedded FeRAM according to a first embodiment of the present invention.

FIG. 6 shows a cross sectional view of the logic circuit embedded FeRAM according to the first embodiment of the present invention formed as mentioned above. The logic circuit embedded FeRAM has a 3-layer wiring line structure. Also, the logic circuit embedded FeRAM has a memory cell array region where the FeRAM cells are arranged, a peripheral circuit region where peripheral circuits such as the sense amplifier, the word line driver and the plate line driver are arranged, and a connection region which is formed between the memory cell array region and the peripheral circuit region.

In the memory cell array region, a ferroelectric capacitor 70 is comprised of a lower electrode 61, a ferroelectric film 62 and an upper electrode 63, and is formed on the uppermost wiring line layer as a wiring line 50, which is necessary for the peripheral circuit region. Also, dummy capacitors 70a and 70b are formed in the connection region to have the same structure as the ferroelectric capacitor 70. Moreover, dummy capacitors 70c and 70d are formed in a part of the peripheral circuit region to have the same structure as the ferroelectric capacitor 70.

The lower electrode 61 of each of the dummy capacitors 70a, 70b, 70c and 70d is thermally connected to a silicon substrate 10 through a "heat transfer route" which comprised of a lower electrode contact plug 51, a third wiring line 50, a third contact plug 41, a second wiring line 40, a second contact plug 31, a first wiring line 30 and a first contact plug 21. Thus, the heat transfer route transfers heat from the silicon substrate 10 to the lower electrode 61.

Next, a manufacturing method will be described with reference to cross sectional views of FIGS. 7A to 7G showing each manufacturing process of the logic circuit embedded FeRAM according to the first embodiment of the present invention.

Figure 7A:
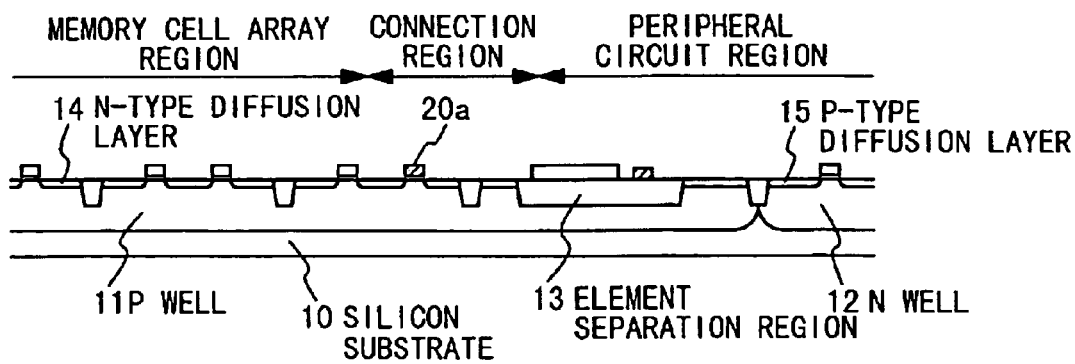
FIGS. 7A to 7G are cross sectional views showing a manufacturing process of the logic circuit embedded FeRAM according to the first embodiment of the present invention.

First, as shown in FIG. 7A, CMOS transistors are formed on a silicon substrate 10. That is, a P-well 11 and an N-well 12 are formed in the silicon substrate 10 and an element isolation region 13 is formed between the connection region and the peripheral circuit region. Next, a gate insulating film (not shown) and gate electrodes 20 are formed in the memory cell array region, the connection region and the peripheral circuit region. Then, n-type diffusion layers 14 are formed for the gate electrodes 20 in the P-well 11 and p-type diffusion layers 15 are formed for the gate electrodes 20 in the N-well 12, by the well-known method. Thus, the CMOS transistors are completed. In this case, the gate electrode 20a is formed in the connection region as a dummy gate electrode.

Figure 7B:
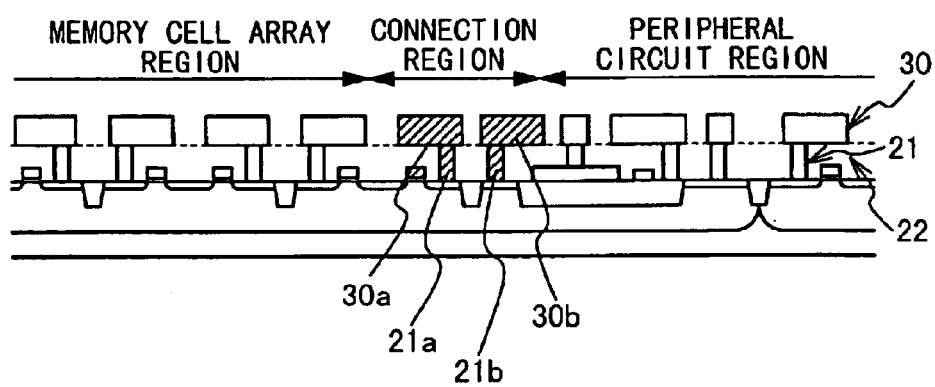

Next, as shown in FIG. 7B, an first interlayer insulating film 22 is formed and first contact plugs 21 are formed to extend to the diffusion layers of the CMOS transistors. The first wiring lines 30 are formed to be connected with the first contact plugs 21. For example, the first contact plug 21 is comprised of tungsten and connects the CMOS transistor and the first wiring line 30. The first contact plugs 21a and 21b are formed in the connection region, and are dummy contact plugs provided to thermally connect the silicon substrate 10 and the first wiring line 30. The interlayer insulating film 22 is comprised of a silicon oxide film as a main component to cover the CMOS transistor. The first wiring line 30 is comprised of aluminum and connects between elements formed in the FeRAM. The first wiring lines 30a and 30b are formed in the connection region, and are dummy wiring lines provided to transfer heat.

Figure 7C:
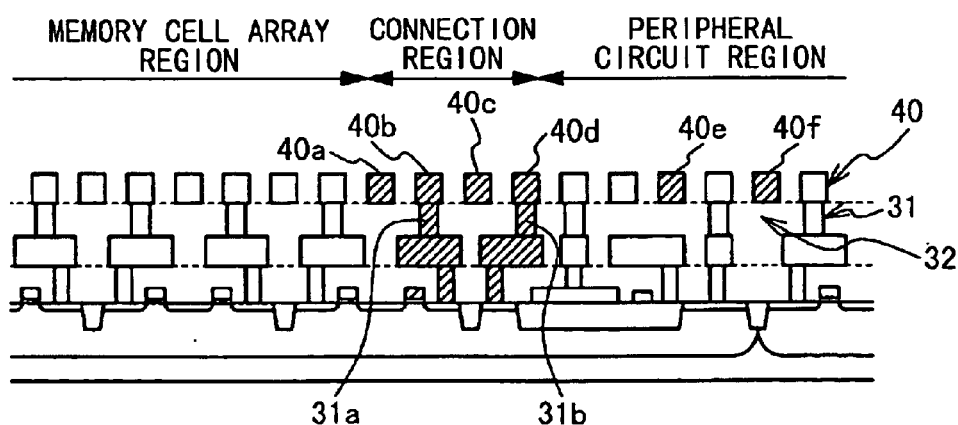

Next, as shown in FIG. 7C, a second interlayer insulating film 32 and a second contact plug 31 are formed to cover the first wiring lines 30. Second contact plugs 31 are formed in the second interlayer insulating film 32 to be connected with the first wiring lines 30. Then, second wiring lines 40 are formed on the second interlayer insulating film 32. The second contact plug 31 is comprised of tungsten and connects a corresponding one of the first wiring lines 30 and a corresponding one of the second wiring lines 40. The second contact plugs 31a and 31b are formed in the connection region as dummy contact plugs provided to thermally connect the first wiring line 30 and the second wiring line 40. The second interlayer insulating film 32 is comprised of a silicon oxide film to cover the first wiring lines 30. The second wiring line 40 is comprised of aluminum and connects elements formed in the FeRAM. The second wiring lines 40a, 40b, 40c, 40d, 40e and 40f are dummy wiring lines are provided to transfer heat. Any of the second wiring lines 40a, 40b, 40c and 40d formed in the connection region are connected directly or via the silicon substrate with the second wiring lines 40e and 40f formed in the peripheral circuit region.

Figure 7D:
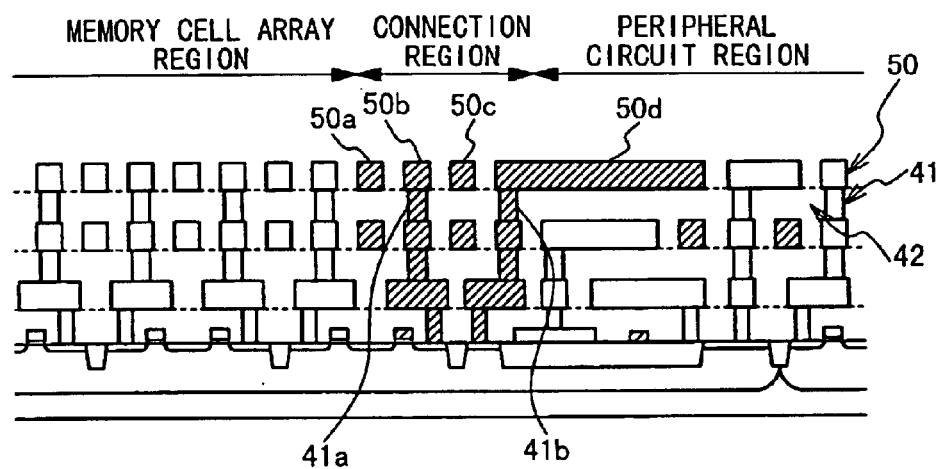

Next, as shown in FIG. 7D, a third interlayer insulating film 42 is formed to cover the second wiring lines, and third contact plugs 41 are formed in the third interlayer insulating film 42 to be connected with the second wiring lines 40 which are connected with the second contact plugs 31. Then, third wiring lines 50 are formed on the third interlayer insulating film 42. The third contact plug 41 is comprised of tungsten and connects a corresponding one of the second wiring lines 40 and a corresponding one of the third wiring lines 50. The third contact plugs 41a and 41b formed in the connection region are dummy contact plugs provided to thermally connect the second wiring lines 40 and the third wiring lines 50. The third interlayer insulating film 42 is comprised of a silicon oxide film and insulates between the second wiring line 40 and the third wiring line 50. The third wiring line 50 is comprised of aluminum and connects between the elements formed in the FeRAM. The third wiring lines 50a, 50b, 50c and 50d are dummy wiring lines to transfer heat. The third wiring line 50d extends to the peripheral circuit region. Any of the third wiring lines 50a, 50b, and 50c formed in the connection region are connected directly or via the silicon substrate 10 with the third wiring line 50d in the peripheral circuit region.

Figure 7E:
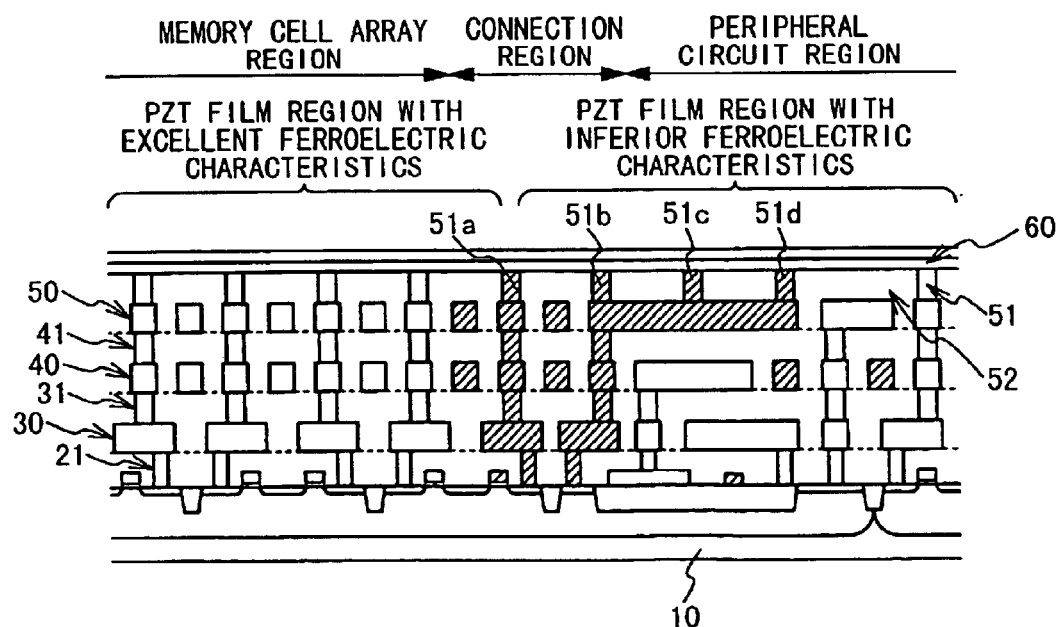

Next, as shown in FIG. 7E, a fourth interlayer insulating film 52 is formed to cover the third wiring lines, and lower electrode contact plugs 51 are formed in the fourth interlayer insulating film 52. Then, a stacked layer 60 of Pt/TiN/Ti for the lower electrode 61 of a ferroelectric capacitor 70 is formed on the fourth interlayer insulating film 52. The lower electrode contact plugs 51 are comprised of tungsten and connect corresponding ones of the third wiring lines 50 and the stacked layer 60. The lower electrode contact plugs 51a and 51b in the connection region and the lower electrode contact plugs 51c and 51d in the peripheral circuit region are dummy contact plugs provided to thermally connect the third wiring line 50 and the stacked layer 60. The lower electrode contact plugs 51a and 511b formed in the connection region are connected directly or indirectly with the lower electrode contact plugs 51c and 51d formed in the peripheral circuit region. The fourth interlayer insulating film 52 is comprised of a silicon oxide film and insulates between the third wiring line 50 and the stacked layer 60. As the material of the stacked layer 60, Pt, Ir and the oxide (e.g., $IrO_2$), Ru and the oxide (e.g., $RuO_2$), the stacked film of Ir/Ti/TiN/Ti, the stacked layer of $SrRuO_3$/Pt/TiN/Ti and so on can be used other than the above stacked layer 60.

Subsequently, while the substrate 10 is heated from the backside of the silicon substrate 10 in the state that the above stacked layer 60 is formed, a PZT layer for ferroelectric films is deposited on the stacked layer 60. Elements such as La and Ca may be added to the PZT film by a small amount for the purpose to improve reliability. The heat applied from the side of the silicon substrate 10 is transferred via the heat transfer route comprised of the first contact plug 21, the first wiring line 30, the second contact plug 31, the second wiring line 40, the third contact plug 41, the third wiring line 50 and the lower electrode contact plug 51 to the Pt/TiN/Ti stacked film 60 in the memory cell array region, the connection region and the peripheral circuit region.

By the way, the heat transfer routes formed in the memory cell array region and the connection region have an approximately uniform density over the memory cell array region and the connection region. Therefore, the whole of the memory cell array region can be heated approximately uniformly. In this way, the peripheral portion of the memory cell array region never remains low in temperature, unlike the conventional example. As a result, the ferroelectric layer excellent in the ferroelectric characteristics can be formed in the whole of the memory cell array region. It should be noted that the density of the heat transfer route is not uniform in the peripheral circuit region. Therefore, because the surface temperature decreases from the connection region to the peripheral circuit region, the ferroelectric layer is formed to be inferior in ferroelectric characteristics. However, because the ferroelectric capacitors formed in the connection region and the peripheral circuit region are the dummy capacitors, no influence gives the performance of the FeRAM cell.

Figure 7F:
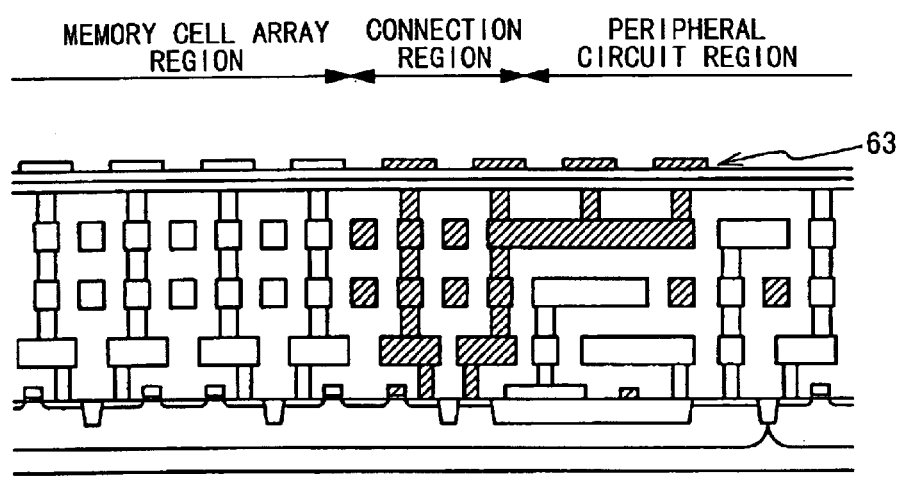
Figure 7G:
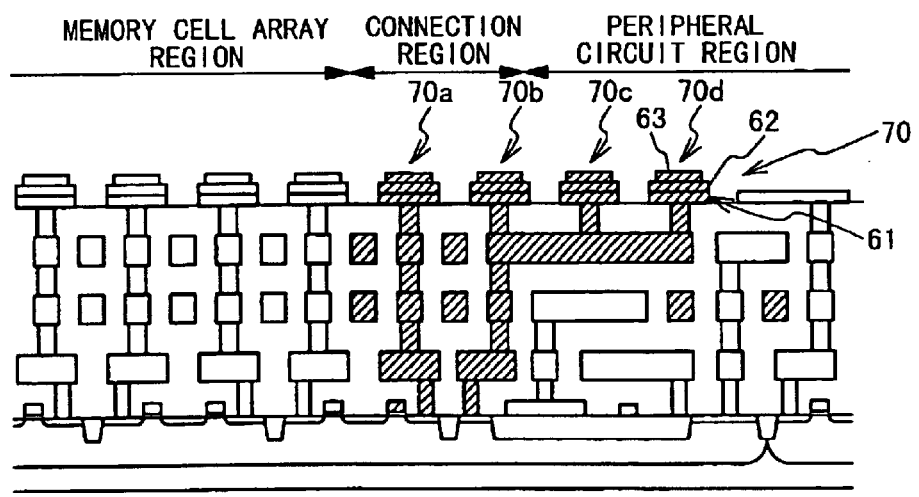

Next, as shown in FIG. 7F, an upper electrode layer is formed on the ferroelectric layer, and then is patterned. Thus, the upper electrodes 63 are formed. The upper electrodes 63 may be comprised of a stacked film of TiN/Ir, a stacked film of TiN/Al/TiN, and a stacked film of Pt/$SrRuO_3$. Then, the PZT layer is patterned to produce the ferroelectric films 62. Subsequently, the stacked layer 60 is patterned using the PZT films 62 to produce the lower electrodes 61. Thus, the ferroelectric capacitors 70 are formed, as shown in FIG. 7G. The ferroelectric capacitors 70a, 70b, 70c and 70d formed in the connection region and the peripheral circuit region are dummy capacitors to provided to transfer the heat.

Next, as shown in FIG. 6, an interlayer insulating film 71 is formed cover the ferroelectric capacitors. Then, upper electrode contacts 71 are formed in the interlayer insulating film 71 on the upper electrode 63. Subsequently, a plate line contact 72 is formed in the peripheral circuit region. Thereafter, a plate line layer is formed on the interlayer insulating film 71 and patterned. Thus, the plate lines are formed. The upper electrode contact 71 is comprised of tungsten, and connects a corresponding one of the ferroelectric capacitors 70 and a corresponding one of the plate lines which are connected with the plate line driver (see FIG. 2). The plate lines 80a, 80b, 80c and 80d formed in the connection region and the peripheral circuit region are dummy plate lines.

As described above, according to the logic circuit embedded FeRAM according to the first embodiment of the present invention, the heat transfer route is provided in the connection region formed between the memory cell array region and the peripheral circuit region to have substantially the same structure as the memory cell array region. When the PZT film 62 is deposited as the ferroelectric film 62, the heat is transferred from the silicon substrate 10 to the stacked film 60 of Pt/TiN/Ti as the lower electrode. Therefore, the memory cell array region is heated approximately uniformly, and the peripheral portion of the memory cell array region is never remained in a low temperature, unlike the conventional device. As a result, the PZT film superior in the ferroelectric characteristics can be formed in the memory cell array region.

It should be noted that in the above-mentioned first embodiment, the heat transfer route is formed in a part of the connection region and peripheral circuit region. However, after the ferroelectric capacitor 70 is formed, the heat transfer route is unnecessary. Therefore, the process for removing the above heat transfer route after forming the ferroelectric capacitor 70 may be provided.

Also, in the above-mentioned first embodiment, the dummy capacitors are formed in the connection region and the peripheral circuit region. Also, the upper electrode contact 71 and the plate line 80 are formed to be connected with the upper electrode of the dummy capacitor. However, like the second embodiment to be described later, only the lower electrode of the dummy capacitor is formed in the connection region and the peripheral circuit region, and the process of forming of the upper electrode 63 and the process of forming the upper electrode contact and the plate line can be omitted.

Moreover, in the above-mentioned first embodiment, the ferroelectric capacitor 70 is formed above the uppermost third wiring line layer. However, the position where the ferroelectric capacitor 70 is formed is not limited to the above position in the present invention and is optional.
(Embodiment 2)

The semiconductor memory device and the manufacturing method according to the second embodiment of the present invention relate to the logic circuit embedded non-volatile SRAM and the manufacturing method.

Figure 8:
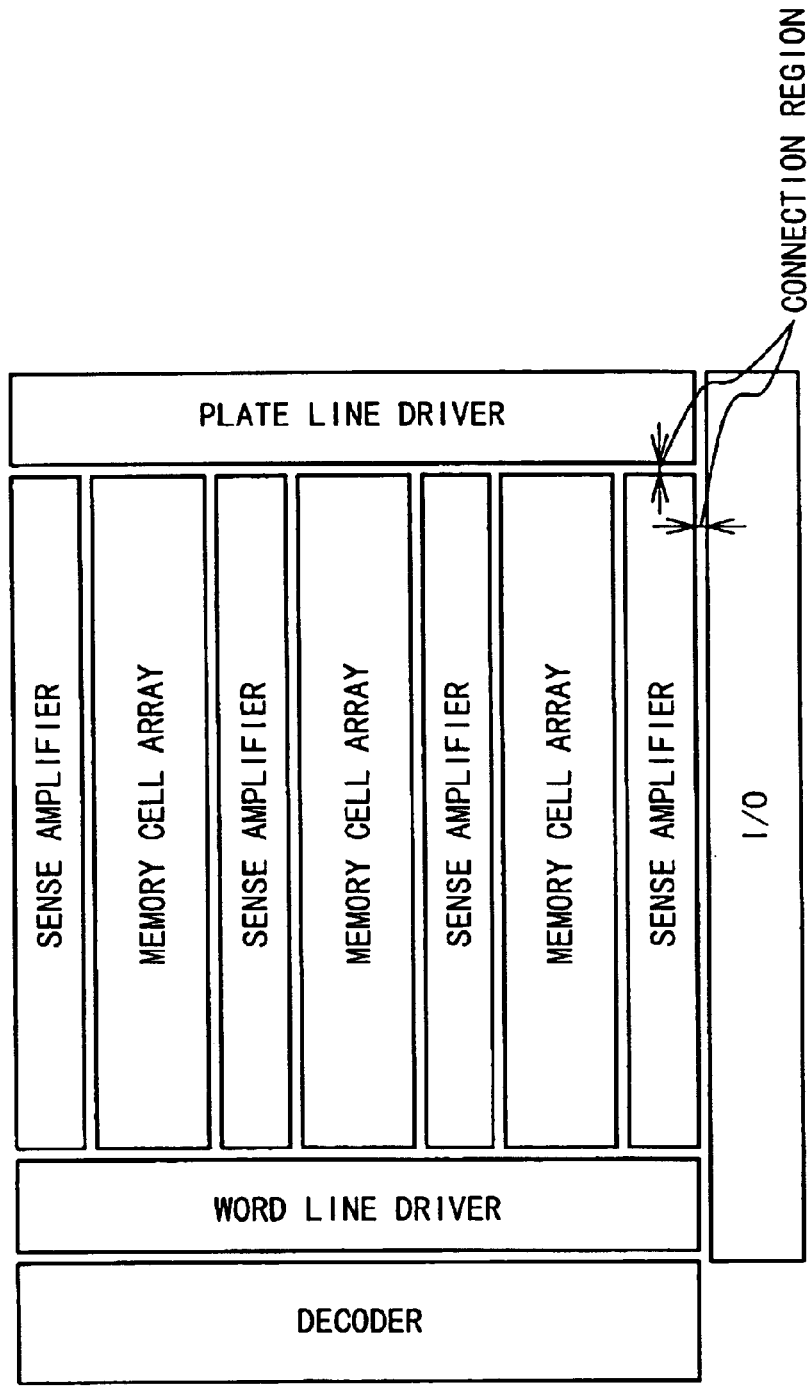
FIG. 8 is a diagram showing the circuit layout of a logic circuit embedded non-volatile SRAM according to a second embodiment of the present invention.

FIG. 8 shows an example o the circuit layout of the logic circuit embedded non-volatile SRAM according to the second embodiment of the present invention. The logic circuit embedded non-volatile SRAM has a plurality of memory cell arrays. Sense amplifiers are arranged to sandwich each memory cell array in the vertical direction. A word line driver is arranged on the left side of the memory cell arrays and the sense amplifiers and a plate line driver is arranged on the right side of the memory cell arrays and the sense amplifiers. Moreover, a decoder is arranged on the left side of the word line driver. An input/output (I/O) circuit is arranged on the lower end side of the lowest sense amplifier. A connection region is formed between the memory cell array and the sense amplifier, between the memory cell array and the word line driver, and between the memory cell array and the plate line driver.

Figure 9:
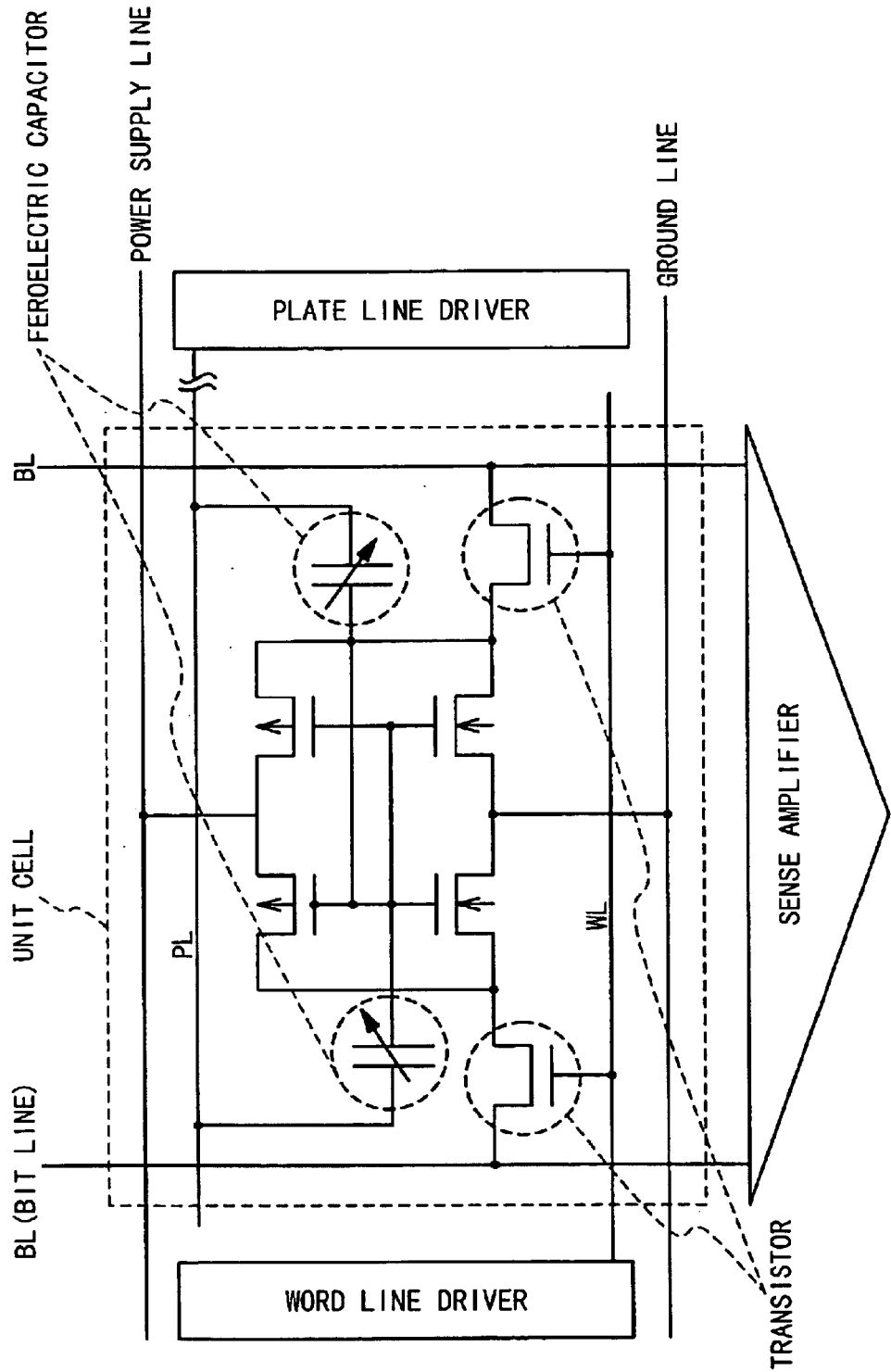
FIG. 9 is a circuit diagram showing an SRAM cell of the logic circuit embedded non-volatile SRAM according to the second embodiment of the present invention.

FIG. 9 shows a circuit diagram of the non-volatile SRAM cell of the above memory cell array. The non-volatile SRAM cell contains six transistors and two ferroelectric capacitors. Because the structure and operation of the non-volatile SRAM cell are well known, the description about them is omitted.

Figure 10:
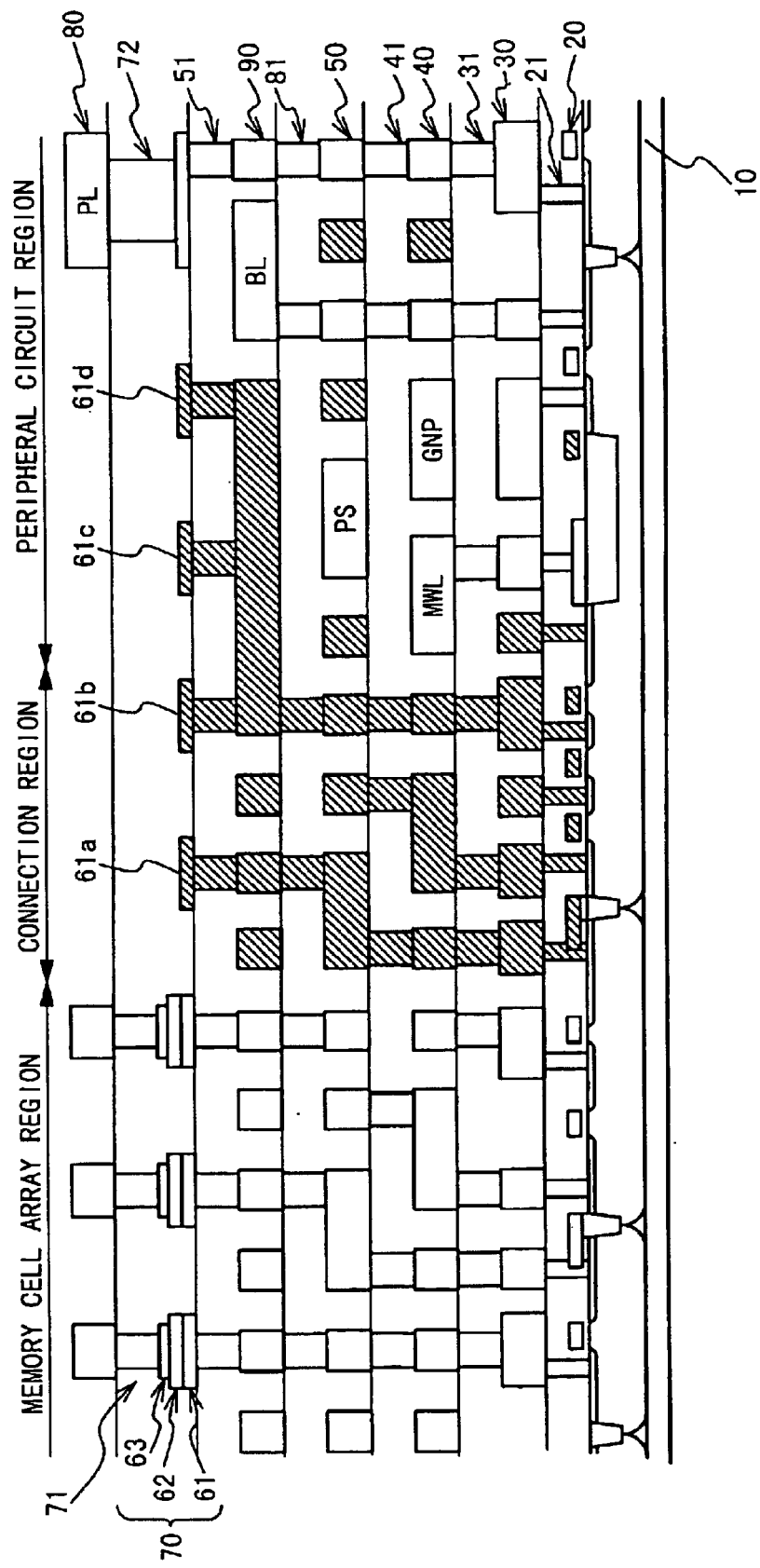
FIG. 10 is a cross sectional view showing the logic circuit embedded non-volatile SRAM according to the second embodiment of the present invention.

FIG. 10 shows a cross sectional view of the logic circuit embedded non-volatile SRAM according to the second embodiment of the present invention. The logic circuit embedded non-volatile SRAM has a 4-layer wiring line structure, and is comprised of a memory cell array region where SRAM cells are arranged, a peripheral circuit region where peripheral circuits such as the sense amplifier, the word line driver and the plate line driver are arranged, and the connection region formed between the memory cell array region and the peripheral circuit region.

In the memory cell array region, the ferroelectric capacitor 70 is comprised of a lower electrode 61, a ferroelectric film 62 and an upper electrode 63, and is formed on the uppermost wiring line. Also, in the connection region, only the lower electrodes 61a and 61b of dummy capacitors are formed to have the same structure as the ferroelectric capacitor 70. Moreover, the lower electrodes 61c and 61d of the dummy capacitors are formed in a part of the peripheral circuit region. The lower electrodes 61a, 61b, 61c and 61d of the dummy capacitors correspond to the dummy electrodes of the present invention.

Each of the lower electrodes 61a, 61b, 61c and 61d is thermally connected to a silicon substrate 10 through a "heat transfer route" comprised of the lower electrode contact plug 51, a fourth wiring line 90, a fourth contact plug 81, a third wiring line 50, a third contact plug 41, a second wiring line 40, a second contact plug 31, a first wiring line 30 and a first contact plug.

Next, a manufacturing method of the logic circuit embedded non-volatile SRAM according to the second embodiment of the present invention will be described with reference to the cross sectional views of FIGS. 11A to 11H.

Figure 11A:
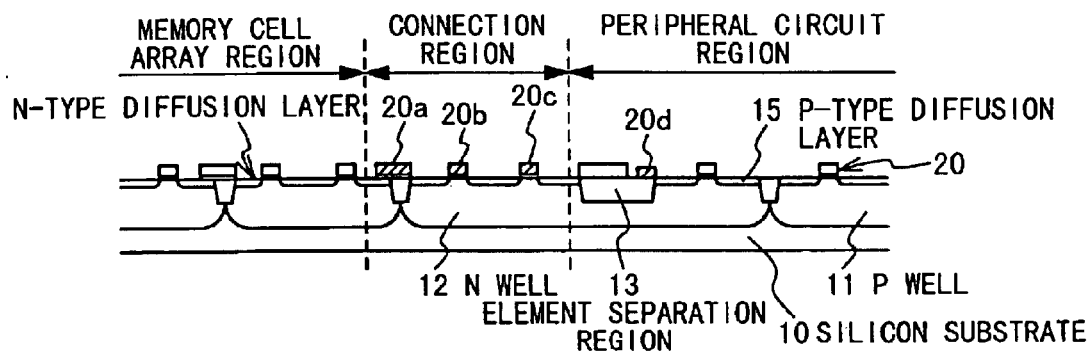
FIGS. 11A to 11H are cross sectional views showing a manufacturing process of the logic circuit embedded non-volatile SRAM according to the second embodiment of the present invention.

At first, as shown in FIG. 11A, CMOS transistors are formed on the silicon substrate 10. That is, P-wells 11 and N-wells 12 are formed in the silicon substrate 10. Then, an element isolation region 13 is formed. Subsequently, a gate insulating film (not shown) and the gate electrodes 20 are formed on the substrate 10. Thereafter, n-type diffusion layers 14 and p-type diffusion layers 15 are formed by 28 the well-known method using the gate electrodes. Thus, the CMOS transistors are formed. Now, the gate electrodes 20a, 20b, and 20c formed in the connection region and the gate electrode 20d formed in the peripheral circuit region are dummy gate electrodes.

Figure 11B:
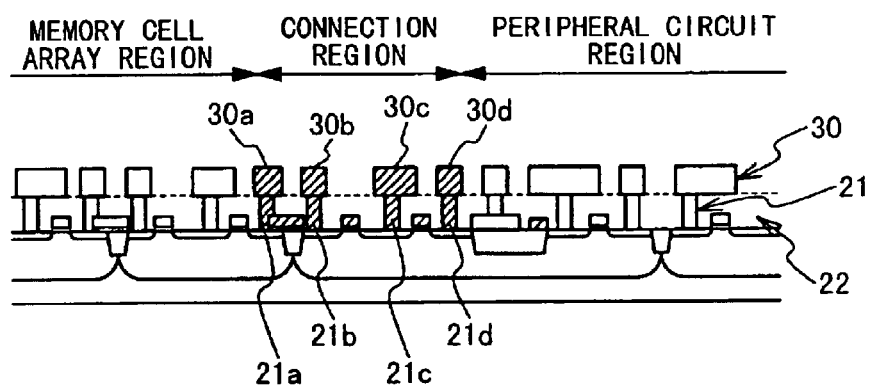

Next, as shown in FIG. 11B, a first interlayer insulating film 22 is formed to cover the CMOS transistors. Subsequently, first contact plugs 21 are formed in the first interlayer insulating film 22 to reach the CMOS transistors. Then, a first wiring line layer is formed on the first interlayer insulating film 22 and patterned. Thus, first wiring lines 30 are formed. The first contact plug 21 is comprised of tungsten and connects a corresponding one of the CMOS transistors and a corresponding one of the first wiring lines 30. The first contact plugs 21a, 21b, 21c and 21d formed in the connection region are dummy contact plugs provided to thermally connect the silicon substrate 10 and the first wiring line 30. Also, the first interlayer insulating film 22 is comprised of a silicon oxide film and insulates between the CMOS transistors and the first wiring lines 30. The first wiring line 30 is comprised of aluminum and connects between elements which are formed in the non-volatile SRAM. The first wiring lines 30a, 30b, 30c and 30d formed in the connection region are dummy wiring lines provided to transfer heat.

Figure 11C:
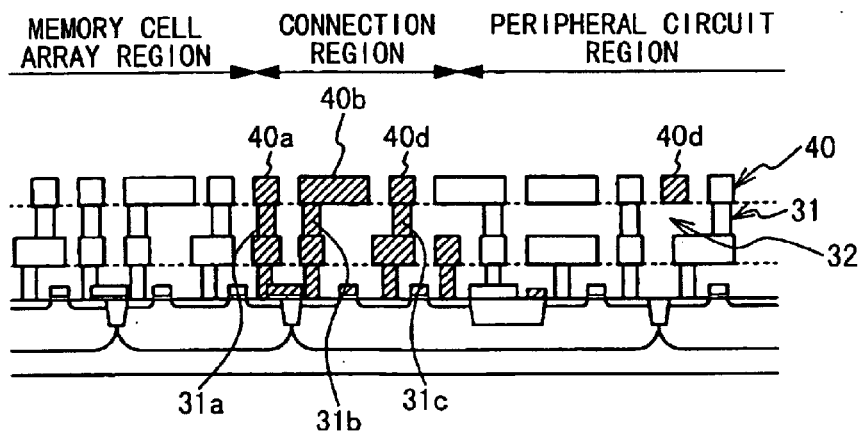

Next, as shown in FIG. 11C, a second interlayer insulating film 32 is formed to cover the first wiring lines 30. Subsequently, second contact plugs 31 are formed in the second interlayer insulating film 32 to reach the first wiring lines 30. Then, a second wiring line layer is formed on the second interlayer insulating film 32 and patterned. Thus, the second wiring lines 40 are formed. The second contact plug 31 is comprised of tungsten and connects a corresponding one of the first wiring lines 30 and a corresponding one of the second wiring lines 40. The second contact plugs 31a, 31b and 31c formed in the connection region and the second contact plugs 31d formed in the peripheral circuit region are dummy contact plugs provided to thermally connect the first wiring lines 30 and the second wiring lines 40. Also, the second interlayer insulating film 32 is comprised of a silicon oxide film and insulates between the first wiring lines 30 and the second wiring lines 40. The second wiring line 40 is comprised of aluminum and connects between elements formed in the non-volatile SRAM. The second wiring lines 40a, 40b and 40c formed in the connection region and the second wiring line 40d formed in the peripheral circuit region are dummy wiring lines provided to transfer heat.

Figure 11D:
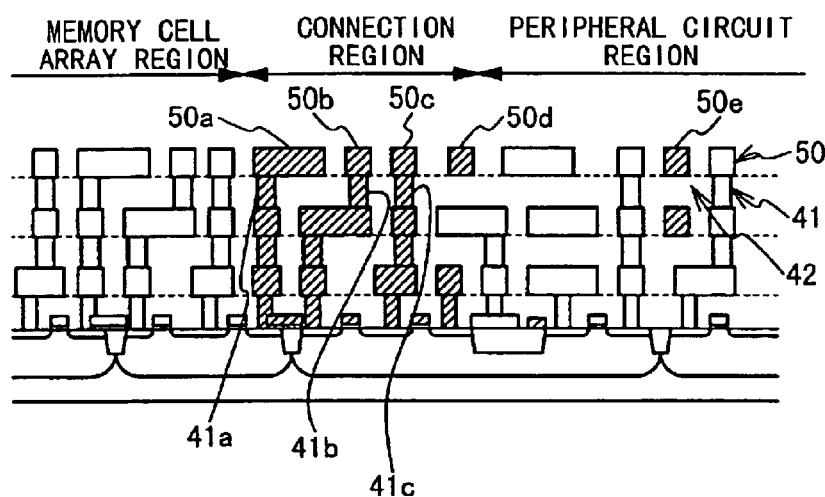

Next, as shown in FIG. 11D, a third interlayer insulating film 42 is formed to cover the second wiring lines 40. Subsequently, third contact plugs 41 are formed in the third interlayer insulating film 42 to reach the second wiring lines 40. Then, a third wiring line layer is formed on the third interlayer insulating film 42 and is patterned. Thus, the third wiring lines 50 are formed. The third contact plug 41 is comprised of tungsten and connects a corresponding one of the second wiring lines 40 and a corresponding one of the third wiring lines 50. The third contact plugs 41a, 41b and 41c formed in the connection region are dummy contact plugs provided to thermally connect the second wiring line 40 and the third wiring line 50. Also, the third interlayer insulating film 42 is comprised of a silicon oxide film and insulates between the second wiring line 40 and the third wiring line 50. The third wiring line 50 is comprised of aluminum and connects between elements formed in the non-volatile SRAM. The third wiring lines 50a, 50b, 50c and 50d in the connection region and the third wiring line 50e formed in the peripheral circuit region are dummy wiring lines provided to transfer heat. The third wiring lines 50a, 50b, 50c and 50d in the-connection region are connected directly or indirectly with the third wiring line 50e.

Figure 11E:
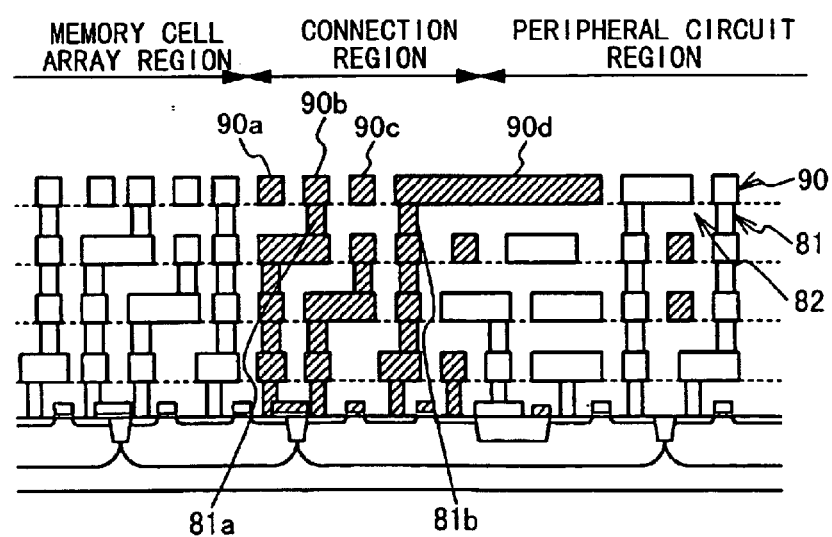

Next, as shown in FIG. 11E, a fourth interlayer insulating film 82 is formed to cover the third wiring lines, and then fourth contact plugs 81 are formed in the fourth interlayer insulating film 82 to reach the third wiring lines 50. Then, a fourth wiring line layer is formed on the fourth interlayer insulating film 82 and is patterned. Thus, the fourth wiring lines 90 are formed. The fourth contact plug 81 is comprised of tungsten and connects a corresponding one of the third wiring line 50 and a corresponding one of the fourth wiring line 90. The fourth contact plugs 81a and 81b formed in the connection region are dummy contact plugs provided to thermally connect the third wiring line 50 and the fourth wiring line 90. Also, the fourth interlayer insulating film 82 is comprised of a silicon oxide film and insulates between the third wiring lines 50 and the fourth wiring lines 90. The fourth wiring line 90 is comprised of aluminum and connects between elements formed in the non-volatile SRAM. The fourth wiring lines 90a, 90b and 90c formed in the connection region and the fourth wiring line 90d extending from the connection region to the peripheral circuit region are dummy wiring lines provided to transfer heat. The fourth wiring lines 90a, 90b and 90c are connected directly or indirectly with the fourth wiring line 90d.

Figure 11F:
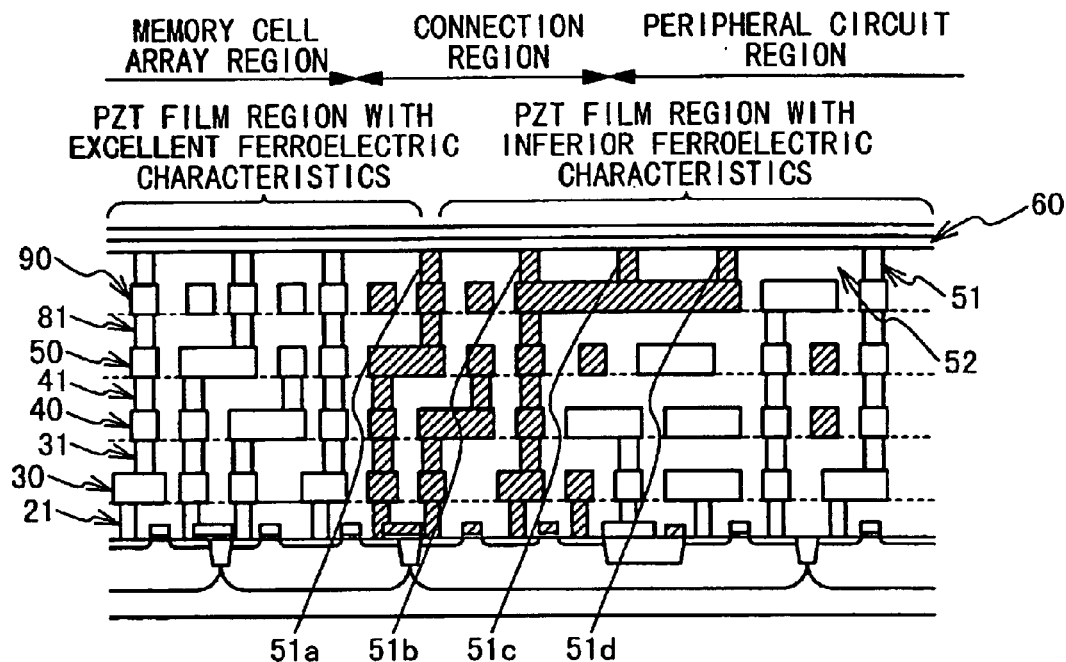

Next, as shown in FIG. 11F, a fifth interlayer insulating film 52 is formed to cover the 32 fourth wiring lines 90, and then lower electrode contact plugs 51 are formed in the fifth interlayer insulating film 52 to reach the fourth wiring lines 90. Subsequently, a stacked layer 60 of Ru/Ti/TiN/Ti for the lower electrode 61 of the ferroelectric capacitor 70 is formed on the fifth interlayer insulating film 52. The lower electrode contact plug 51 is comprised of tungsten and connects a corresponding one of the fourth wiring line 90 and the stacked film 60. The lower electrode contact plugs 51a and 51b formed in the connection region and the lower electrode contact plugs 51c and 51d formed in the peripheral circuit region are dummy contact plugs provided to thermally connect the fourth wiring line 90 and the stacked film 60. The lower electrode contact plugs 51a and 51b are connected directly or indirectly with the lower electrode contact plugs 51c and 51d. Also, the fifth interlayer insulating film 52 is comprised of a silicon oxide film and insulates between the fourth wiring lines 90 and the stacked film 60. As the material of the stacked film 60, Pt, Ir and the oxide (e.g., IrO2), Ru and the oxide (e.g., RuO2), the stacked film of Ir/Ti/TiN/Ti, the stacked film of SrRuO3/Pt/TiN/Ti and so on can be used other than the above materials.

Subsequently, in the state in which the above stacked film 60 is formed, the PZT layer for the ferroelectric films is deposited while the whole silicon substrate is heated to the temperature of 410° C. from the side of the silicon substrate 10. The film thickness of the PZT layer formed is 250 nm. In this case, the heat applied from the side of the silicon substrate 10 is transferred to the stacked layer 60 of Ru/Ti/TiN/Ti in the memory cell array region, the connection region and the peripheral circuit region via the heat transfer route comprised of the first contact plug 21, the first wiring line 30, the second contact plug 31, the second wiring line 40, the third contact plug 41, the third wiring line 50, the fourth contact plug 81, the fourth wiring line 90 and the lower electrode contact plug 51.

Now, because the heat transfer routes are formed in the memory cell array region and the connection region to have a substantially uniform density, the memory cell array region is heated almost uniformly, and the peripheral section of the memory cell array region never remain low in temperature, unlike the conventional example. As a result, the PZT layer superior in the ferroelectric characteristics can be formed in the memory cell array region. It should be noted that the density of the heat transfer route is not uniform in the peripheral circuit region, compared with the memory cell array region and the connection region. Therefore, because the heat inclination is generated from the connection region to the peripheral circuit region, the PZT layer inferior in the ferroelectric characteristics is formed. However, the ferroelectric capacitors formed in these regions are dummy capacitors, and there is no influence in the performance of the SRAM cell.

Figure 11G:
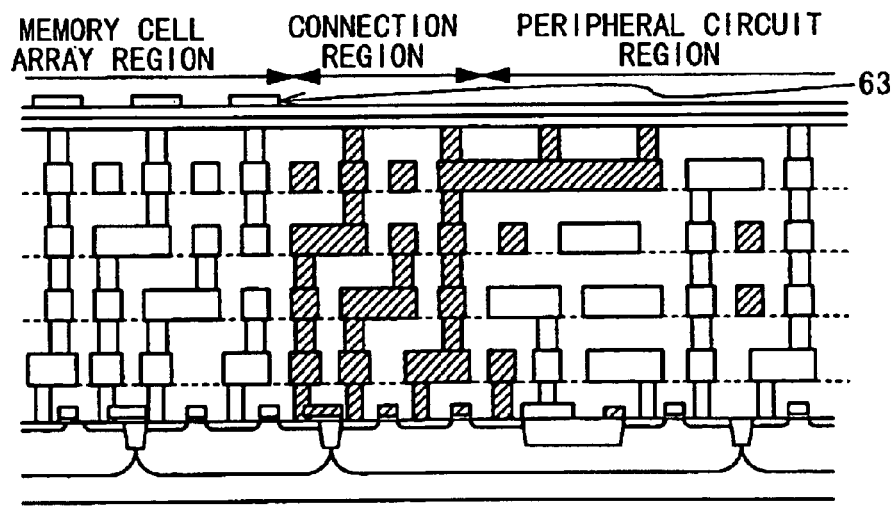
Figure 11H:
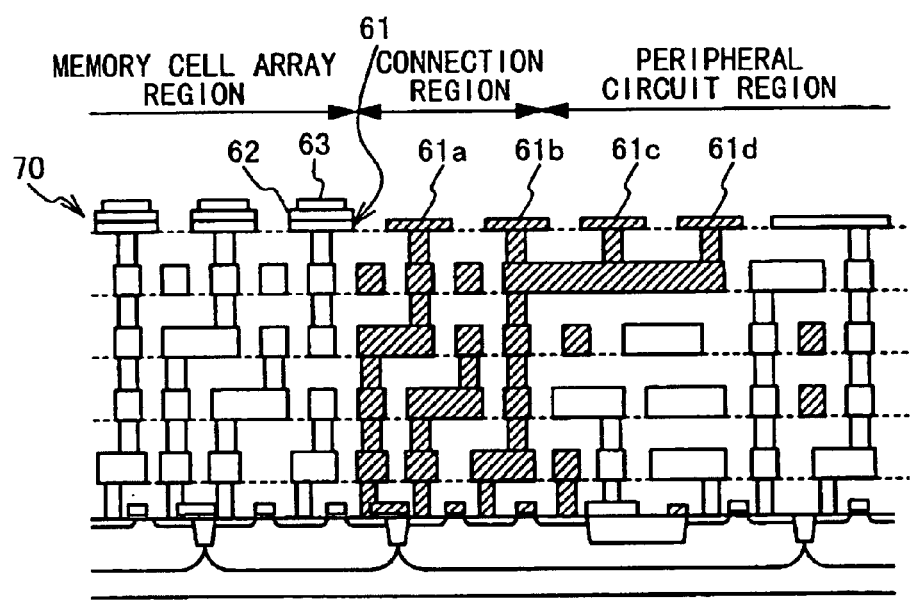

Next, as shown in FIG. 11G, the upper electrode layer is formed on the PZT layer in the memory cell array region. Then, the upper electrode layer is patterned to produce the upper electrodes 63. In this case, no upper electrode is formed in the connection region and the peripheral circuit region. The upper electrode 63 can be composed of the stacked film of TiN/Ru.

Next, as shown in FIG. 13, the PZT layer is patterned. Thus, the ferroelectric films 62 are formed on the lower electrode layer 60. Subsequently, the lower electrode layer 60 is patterned using the ferroelectric films 62. Thus, the lower electrodes 61 are formed. In this way, the ferroelectric capacitors 70 are formed in the memory cell array region. Portions 61a, 61b, 61c and 61d corresponding to the lower electrodes 61 of the ferroelectric capacitor 70 are left as the dummy electrode in the connection region and the peripheral circuit region.

Next, as shown in FIG. 10, an interlayer insulating film is formed to cover the ferroelectric capacitors 70. Subsequently, upper electrode contacts 71 are formed in the interlayer insulating film to reach the upper electrodes 63 in the memory cell array region. Also, a plate line contact 72 is formed in the interlayer insulating film in the peripheral circuit region. Then, a plate line layer is formed on the interlayer insulating film and patterned. Thus, plate lines 80 are formed. The upper electrode contact 71 is comprised of tungsten and connects the ferroelectric capacitor 70 and the plate line driver (see FIG. 8) via the plate line. In case of the non-volatile SRAM, any dummy plate line contact and plate line are not formed.

As described above, according to the logic circuit embedded non-volatile SRAM according to the second embodiment of the present invention, the heat transfer route having the same structure as in the memory cell array region is formed in the connection region between the memory cell array region and the peripheral circuit region. When the PZT layer is deposited for the ferroelectric film 62 on the stacked film 60, the heat is transferred from the silicon substrate 10 to the stacked film 60. Therefore, the memory cell array region is heated uniformly and there is no case that the peripheral section of the memory cell array region remains low in temperature, unlike the conventional example. As a result, in the memory cell array region, the PZT film is formed to be excellent in the ferroelectric characteristics.

It should be noted that in the abovementioned second embodiment, the heat transfer route is formed in the connection region and the peripheral circuit region. However, after the ferroelectric capacitors are formed, the heat transfer route is unnecessary. Therefore, the process to remove the above heat transfer route may be provided after forming the ferroelectric capacitor.

Also, in the above-mentioned second embodiment, the lower electrode as the dummy electrode of the dummy capacitor is formed in the connection region and the peripheral circuit region, but the upper electrode 63, the upper electrode contact and the plate line are not formed. However, the dummy capacitor may be formed in the connection region and the peripheral circuit region like the above-mentioned first embodiment. Also, the upper electrode contact 71 and the plate line 80 may be formed to be connected with the upper electrode of the dummy capacitor.

Moreover, in the above-mentioned second embodiment, the ferroelectric capacitor is formed on the fourth wiring line as the uppermost layer. However, in the present invention, the position where the ferroelectric capacitor 70 is formed is not limited to the above position and may be optional.

As described above, according to the present invention, there are provided the semiconductor memory device and the manufacturing method in which the memory cells with a large operation margin are formed over the whole region of the memory cell array.

What is claimed is:

1. A semiconductor memory device having a memory cell array region, a peripheral circuit region and a connection region between said memory cell array region and said peripheral circuit region, comprising:

ferroelectric capacitors formed on a semiconductor substrate via an interlayer insulating film in said memory cell array region; and conductive films formed on said interlayer insulating film in said connection regions conductive routes passing through said interlayer insulating film in said connection region, each conductive route being connected with said conductive films and said semiconductor substrate, and wherein both said conductive films and said conductive routes in said connection region are dummy structures.

2. The semiconductor memory device according to claim 1, further comprising MOS transistors formed on said semiconductor substrate in said memory cell array region and said connection region, and wherein each of said ferroelectric capacitors is connected with one of said MOS transistors formed in said memory cell array region and each of said conductive films is connected with one of said MOS transistors formed in said connection regions, wherein said MOS transistors formed in said connection region each includes a dummy gate electrode.

3. The semiconductor memory device according to claim 1, wherein a density of said ferroelectric capacitors is substantially the same as that of said conductive films.

4. The semiconductor memory device according to claim 1, wherein said semiconductor memory device is a logic circuit embedded FeRAM.

5. The semiconductor memory device according to claim 1, wherein each ferroelectric capacitor comprises lower electrode layer, a ferroelectric film, and an upper electrode layer, and wherein the semiconductor memory device further comprises:

a second interlayer insulating film on said ferroelectric capacitors and said conductive films;

wiring lines on said second interlayer insulating film over at least said memory cell array region; and contact plugs, respectively providing conductive paths through said second interlayer insulating film, from upper electrode layers of the ferroelectric capacitors to the wiring lines, wherein no conductive paths through said second interlayer insulating film are provided for the conductive films formed in said connection region.

6. The semiconductor memory device according to claim 1, wherein the dummy structures further comprise additional conductive films, formed in said peripheral circuit region and connected with any of said conductive routes in said connection region.

7. The semiconductor memory device according to claim 1, wherein said peripheral circuit region comprise at least a sense amplifier.

8. The semiconductor memory device according to claim 1, wherein said peripheral circuit region comprise at least a line driver.

9. The semiconductor memory device according to claim 3, wherein in said connection region, in a direction orthogonal to said memory cell array regions and said peripheral circuit region, there are a plurality of said conductive films.

10. The semiconductor memory device according to claim 3, further comprising additional conductive routes in said memory cell array region, passing through said interlayer insulating film, each conductive route being connected with a respective ferroelectric capacitor and said semiconductor substrate, wherein the conductive routes in the memory cell array region and the connection region have a substantially uniform density over the memory cell array region and the connection region.

11. The semiconductor memory device according to claim 10, wherein in said connection region, in a direction orthogonal to said memory cell array regions and said peripheral circuit region, there are a plurality of said conductive routes.

12. A semiconductor memory device having a memory cell array region, a peripheral circuit region and a connection region between said memory cell array region and said peripheral circuit region, comprising:

ferroelectric capacitors formed on a semiconductor substrate via an interlayer insulating film in said memory cell array region; and conductive films formed on said interlayer insulating film in said connection region, wherein said conductive films are connected with said semiconductor substrate via conductive routes passing through said interlayer insulating film, respectively, and wherein a layer for said conductive films is formed when a lower electrode layer for said ferroelectric capacitors is formed.

13. The semiconductor memory device according to claim 12, wherein said lower electrode layer is formed of material containing at least one of platinum, iridium, iridium oxide, ruthenium and ruthenium oxide.

14. A semiconductor memory device having a memory cell array region, a peripheral circuit region and a connection region between said memory cell array region and said peripheral circuit region, comprising:

ferroelectric capacitors formed on a semiconductor substrate via an interlayer insulating film in said memory cell array region;

conductive films formed on said interlayer insulating film in said connection region; and additional conductive films formed in said peripheral circuit region, wherein said conductive films are connected with said semiconductor substrate via conductive routes passing through said interlayer insulating film, respectively, and wherein said additional conductive films are connected with any of said conductive routes in said connection region.

15. A semiconductor memory device having a memory cell array region, a peripheral circuit region and a connection region between said memory cell array region and said peripheral circuit region comprising:

ferroelectric capacitors formed on a semiconductor substrate via an interlayer insulating film in said memory cell array region; and conductive films formed on said interlayer insulating film in said connection region, wherein said conductive films are connected with said semiconductor substrate via conductive routes passing through said interlayer insulating film, respectively, and wherein said semiconductor memory device is a logic circuit embedded non-volatile SRAM.

* * * * *